United States Patent
Song et al.

(10) Patent No.: US 8,059,451 B2
(45) Date of Patent: Nov. 15, 2011

(54) MULTIPLE VALUED DYNAMIC RANDOM ACCESS MEMORY CELL AND THEREOF ARRAY USING SINGLE ELECTRON TRANSISTOR

(75) Inventors: Bok Nam Song, Gyeonggi-do (KR); Jung Bum Choi, Cheongju-si (KR); Hun Woo Kye, Yongin-si (KR)

(73) Assignee: NanoChips, Inc. (KR)

( * ) Notice: Subject to any disclaimer, the term of this patent is extended or adjusted under 35 U.S.C. 154(b) by 153 days.

(21) Appl. No.: 12/523,181

(22) PCT Filed: Dec. 20, 2007

(86) PCT No.: PCT/KR2007/006695
§ 371 (c)(1),
(2), (4) Date: Jan. 5, 2010

(87) PCT Pub. No.: WO2008/088135
PCT Pub. Date: Jul. 24, 2008

(65) Prior Publication Data
US 2010/0118597 A1    May 13, 2010

(30) Foreign Application Priority Data

Jan. 16, 2007  (KR) .......................... 10-2007-0004702
Dec. 6, 2007   (KR) .......................... 10-2007-0126022

(51) Int. Cl.
*G11C 11/24*    (2006.01)
(52) U.S. Cl. ........................ 365/149; 365/222
(58) Field of Classification Search .................. 365/149, 365/222, 63
See application file for complete search history.

(56) References Cited

U.S. PATENT DOCUMENTS

| 5,249,155 | A  | * | 9/1993  | Arimoto et al. ............... 365/222 |
| 6,323,504 | B1 |   | 11/2001 | Shin et al. |
| 6,597,036 | B1 |   | 7/2003  | Lee et al. |
| 6,754,101 | B2 | * | 6/2004  | Terzioglu et al. ......... 365/185.02 |

FOREIGN PATENT DOCUMENTS

| KR | 10-2000-0032310 |    | 6/2000 |
| WO | 2006/083035     | A1 | 8/2006 |

* cited by examiner

*Primary Examiner* — Son Dinh
(74) *Attorney, Agent, or Firm* — DeMont & Breyer, LLC

(57) ABSTRACT

Provided is a multi-valued dynamic random access memory (DRAM) cell using a single electron transistor (SET). The multi-valued DRAM cell using the SET applies different refresh signals to a load current transistor for controlling current supply to the SET and a voltage control transistor for controlling a terminal voltage of the SET and refreshes a data value stored in the SET by a predetermined period to reduce standby current and stably supply a voltage low enough to satisfy a coulomb-blockade condition to the terminal of the SET.

18 Claims, 7 Drawing Sheets

[Fig. 1]
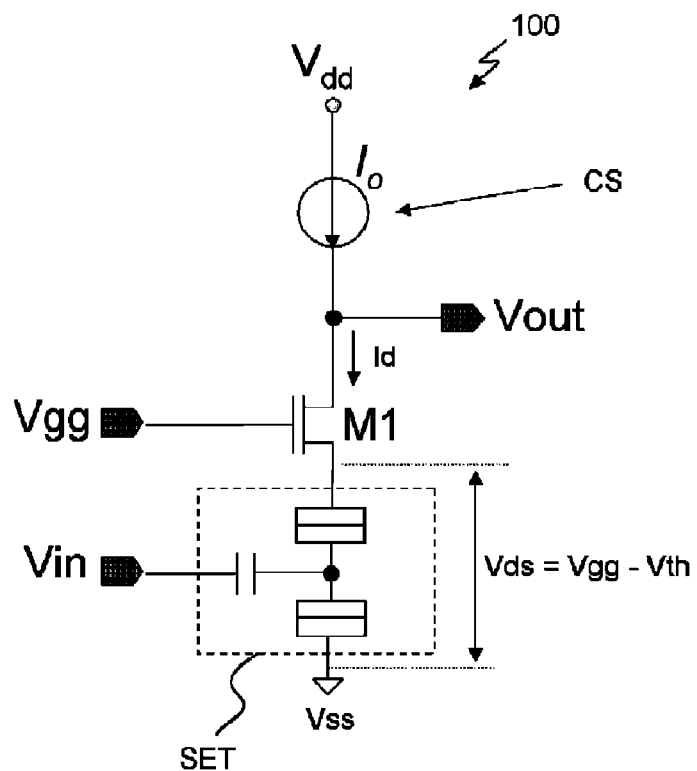
[Fig. 2]
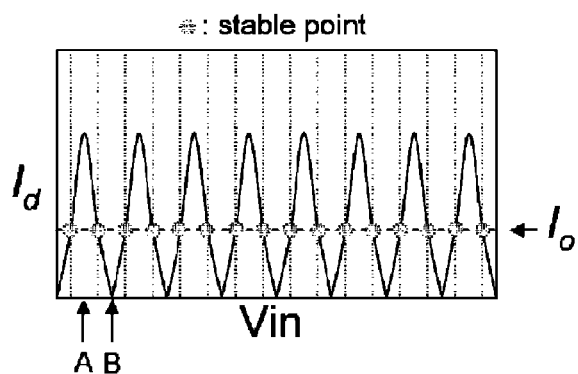
[Fig. 3]
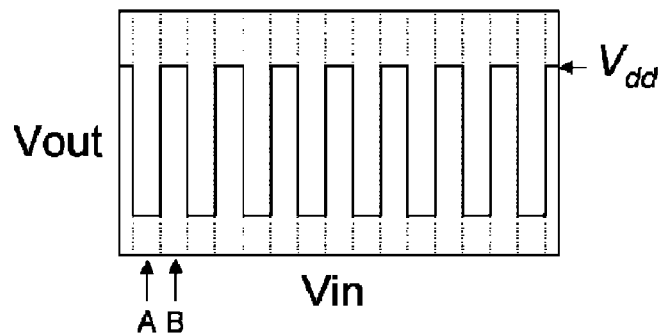

[Fig. 4]
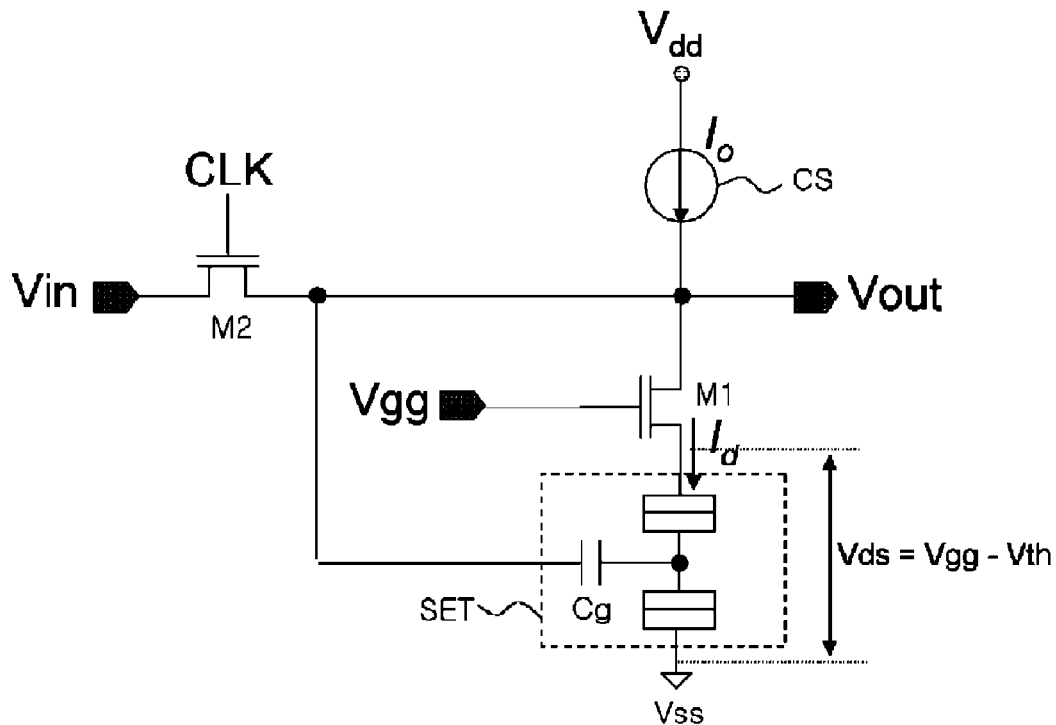
[Fig. 5]
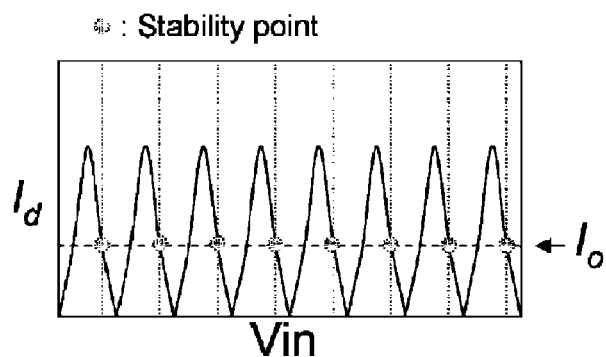
[Fig. 6]
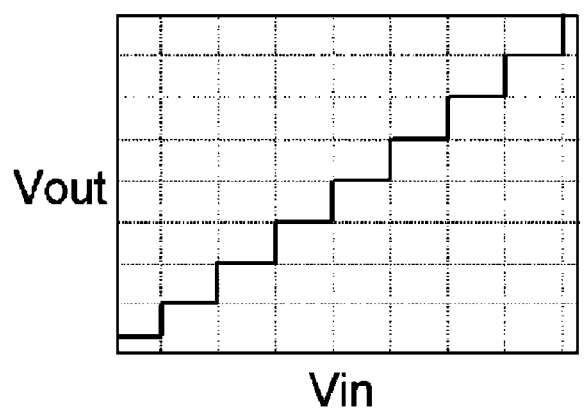

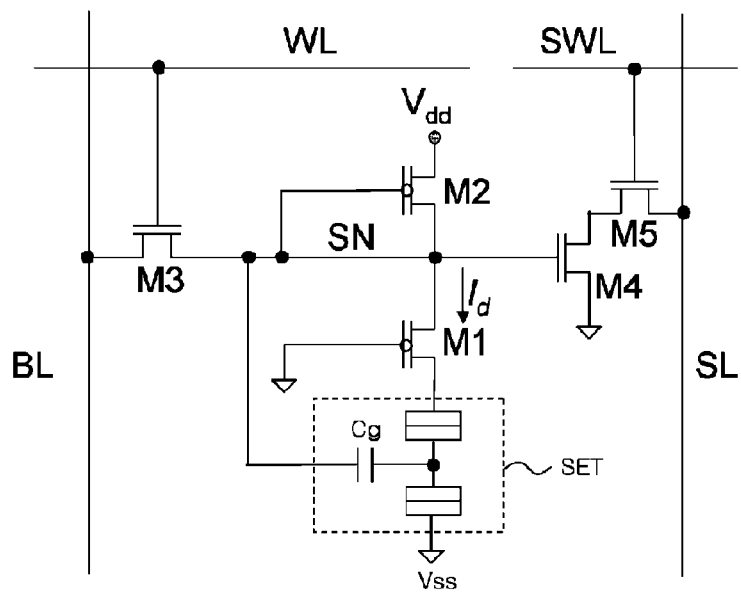
[Fig. 7]
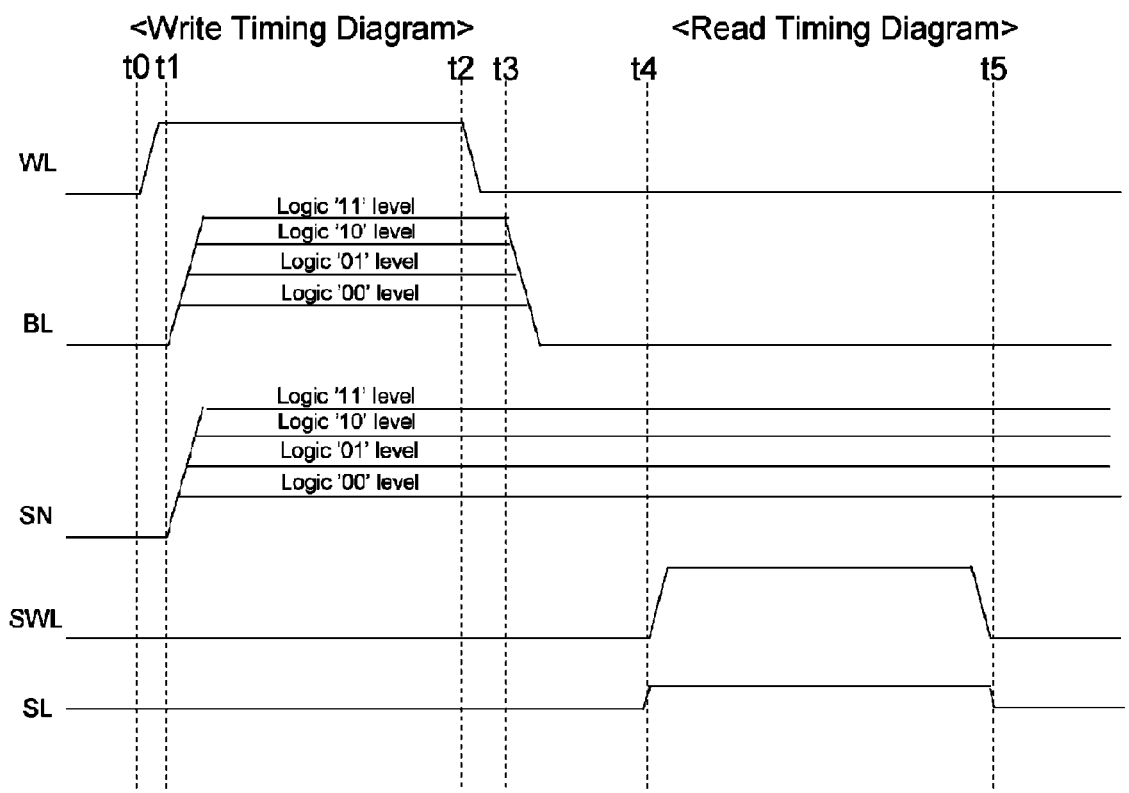
[Fig. 8]

[Fig. 9]
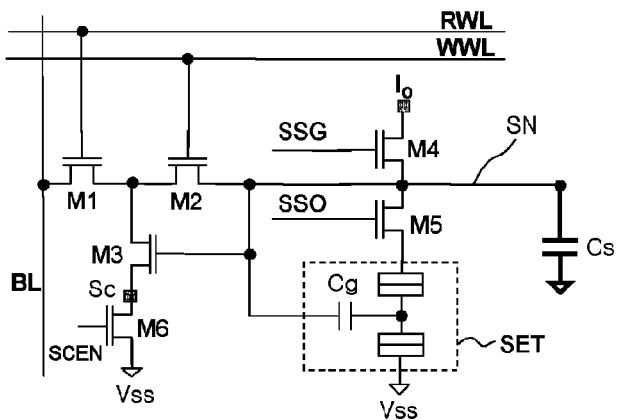
[Fig. 10]
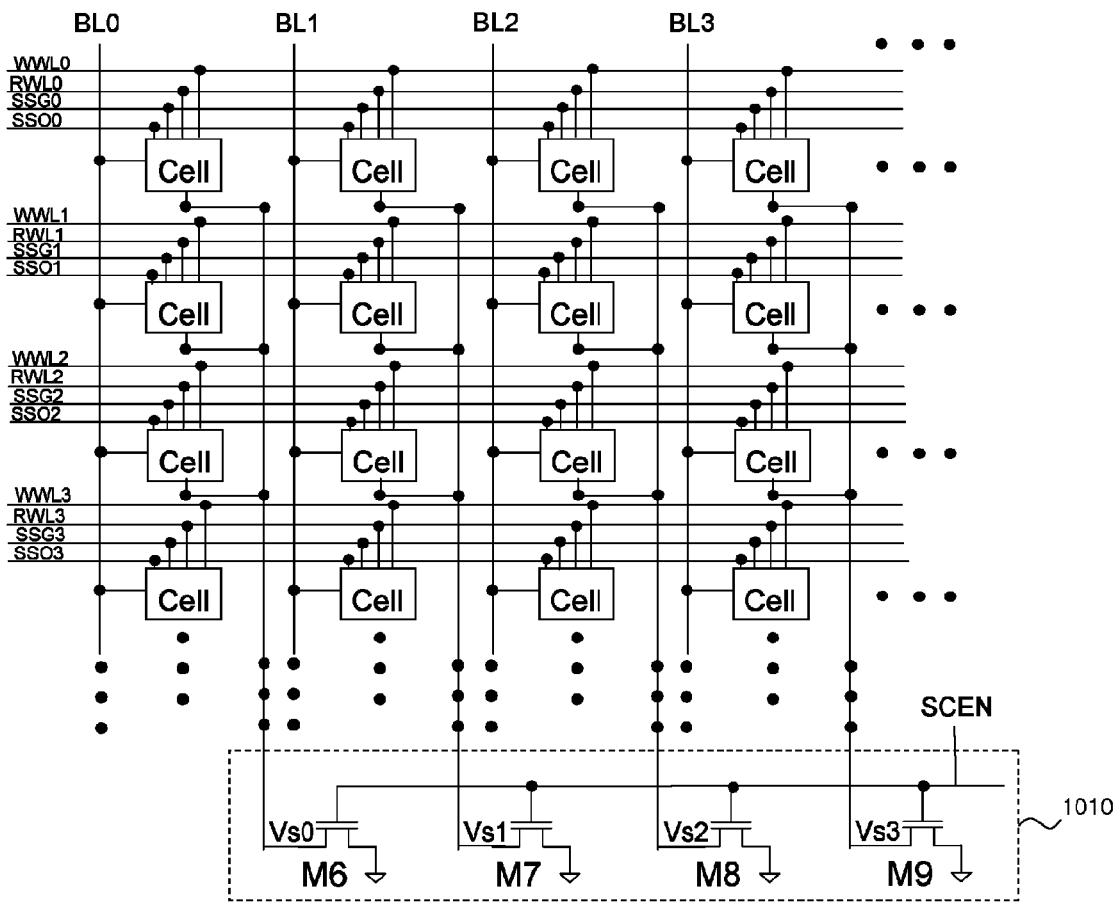

[Fig. 11]
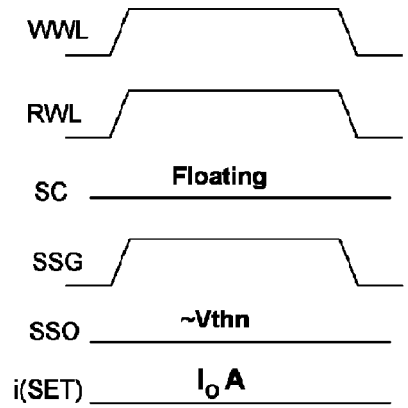
[Fig. 12]
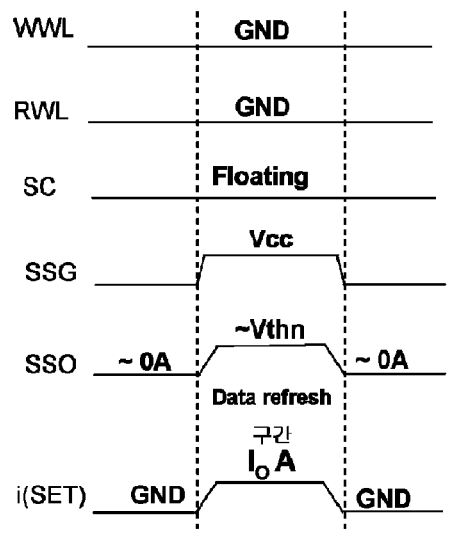
[Fig. 13]
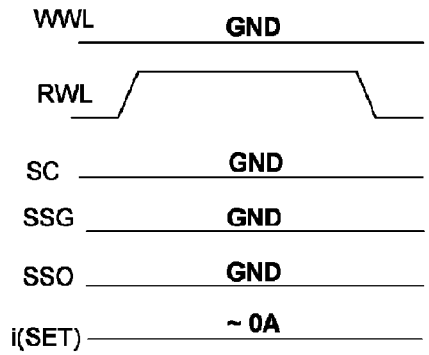

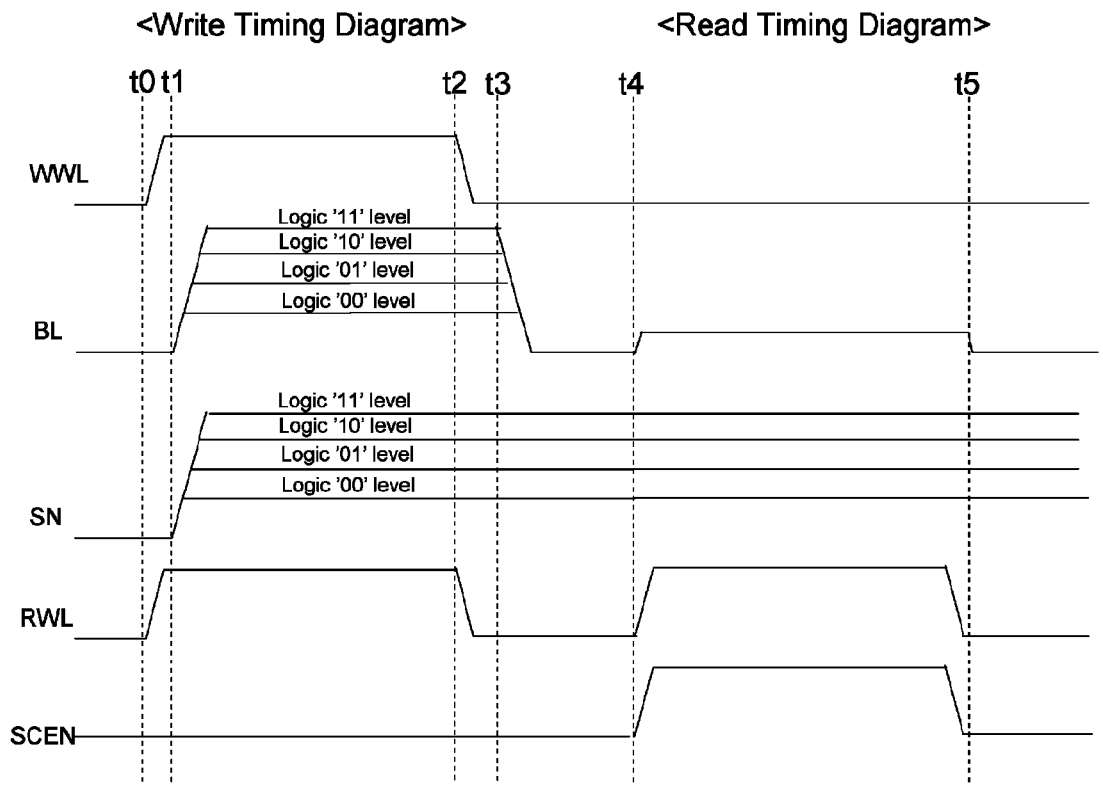
[Fig. 14]
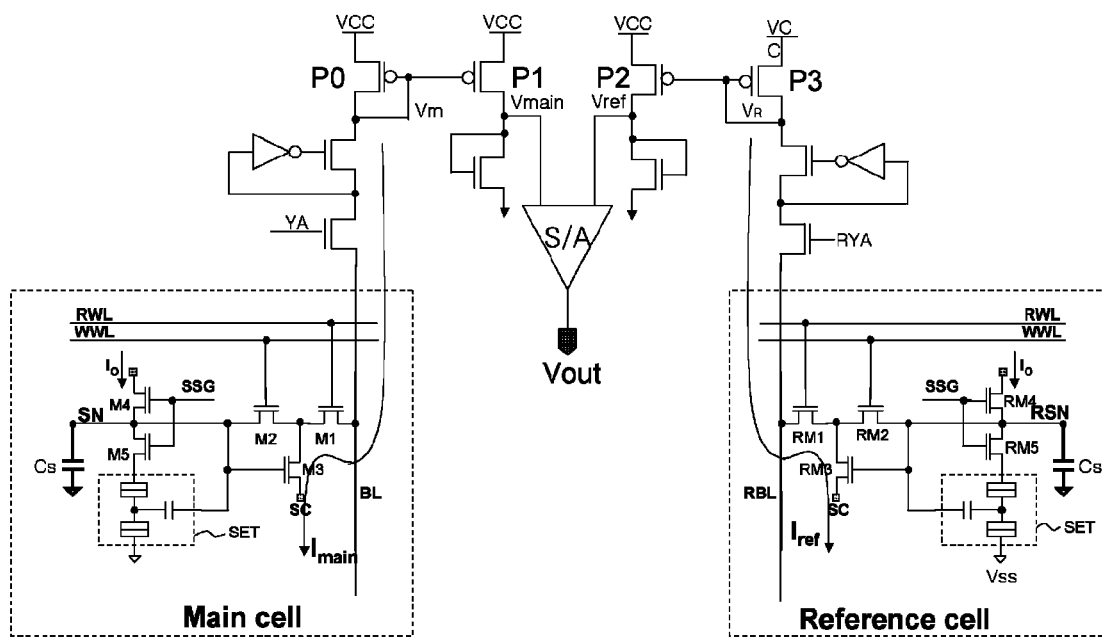
[Fig. 15]

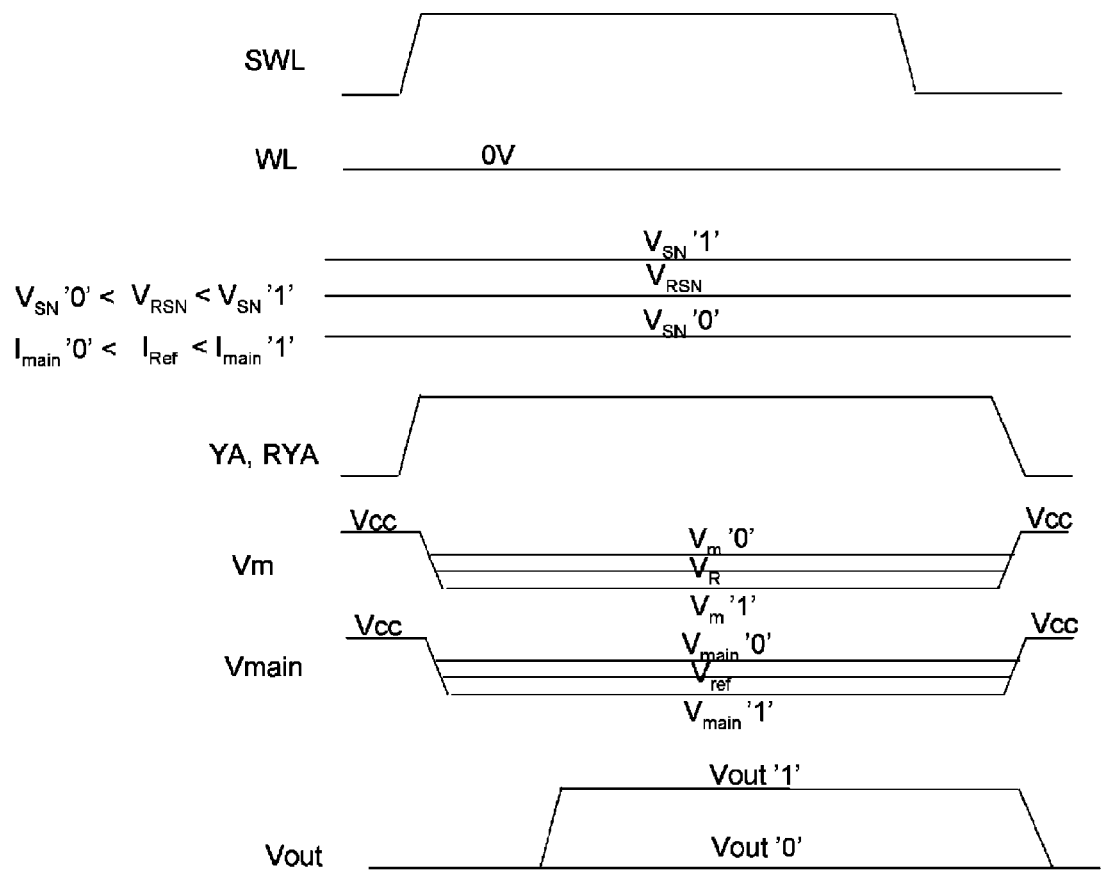

MULTIPLE VALUED DYNAMIC RANDOM ACCESS MEMORY CELL AND THEREOF ARRAY USING SINGLE ELECTRON TRANSISTOR

TECHNICAL FIELD

The present invention relates to a multi-valued dynamic random access memory (DRAM) cell using a single electron transistor (SET), and more particularly, to a multi-valued DRAM cell using a SET, which applies refresh signals to a load current transistor for controlling current supply to the SET and a voltage control transistor for controlling a terminal voltage of the SET and performs a refreshing operation on a data value stored in the SET by a predetermined period, to reduce a standby current and stably supply a voltage low enough to satisfy a coulomb-blockade condition to a terminal of the SET.

BACKGROUND ART

A single electron transistor (SET) has characteristics for repeating increase and decrease of a current flowing between a drain and a source according to a bias voltage applied to a gate electrode. Researches on an application circuit applying electrical characteristics of the SET in addition to the SET have been actively carried out (see: "Correlated discrete transfer of single electrons in ultrasmall tunnel junctions" by K.K. Likharev, IBM J. Res. Develop, vol. 32, pp. 144-158, January 1988, and "Complementary digital logic based on the Coulomb blockade" by J. R. Tucker, J. Appl. Phys., vol. 72, pp. 4399-4413, November, 1992).

FIG. 1 is a circuit diagram of a universal literal gate (ULG) using a single gate SET and a metal-oxide-semiconductor (MOS) transistor. The ULG 100 includes a current source CS, a first MOS transistor M1, and the SET.

The current source CS supplies a predetermined current $I_o$ to the first MOS transistor M1 and the SET. The first MOS transistor M1 transmits the current $I_o$ supplied from the current source CS connected to a terminal to the SET connected to the other terminal in response to a bias voltage $V_{gg}$ applied to a gate. The SET changes a value and a phase of a current $I_d$ supplied from a terminal according to an input voltage $V_{in}$ applied to a gate.

FIG. 2 is view illustrating a relationship between the input voltage $V_{in}$ of the ULG illustrated in FIG. 1 and a current $I_d$ flowing to the SET, and FIG. 3 is a view illustrating a relationship between the input voltage $V_{in}$ of the ULG illustrated in FIG. 1 and an output voltage $V_{out}$.

Referring to FIGS. 2 and 3, as the input voltage $V_{in}$ increases, increase and decrease of the current $I_d$ flowing through the ULG 100 are repeated, and the voltage $V_{out}$ of the output terminal is changed according to a period that is the same as the repeat period. Here, the current $I_o$ that is supplied from the current source CS is constant.

Referring to FIGS. 1, 2, and 3, when a fixed bias voltage $V_{gg}$ is applied to a gate terminal of the first MOS transistor M1, a drain voltage $V_{ds}$ of the SET is maintained at a constant voltage ($V_{gg}-V_{th}$). Here, the drain voltage ($V_{gg}V_{th}$) of the SET is a voltage low enough to satisfy the coulomb-blockade condition of the SET, and therefore, the drain current of the SET is periodically increased and decreased according to the input voltage $V_{in}$.

Specifically, there is a section A in which the current $I_d$ flowing through the ULG 100 is larger than the fixed current $I_o$ supplied from the current source CS according to the input voltage $V_{in}$. In this case, a voltage level of the output terminal $V_{out}$ has to be lowered so that a current corresponding to a difference ($I_d-I_o$) between the two currents is supplied to the ULG 100 through the first MOS transistor M1. In addition, there is a section B in which the current flowing through the ULG 100 is smaller than the fixed current $I_o$ supplied from the current source CS according to the input voltage $V_{in}$. In this case, the voltage level of the output terminal $V_{out}$ has to be increased so that the current corresponding to the difference ($I_o-I_d$) between the two currents is blocked by the first MOS transistor M1. Consequently, as illustrated in FIG. 3, characteristics such as a square waveform having a voltage swing can be represented.

FIG. 4 is a circuit diagram of a quantizer using the ULG illustrated in FIG. 1. Referring to FIG. 4, the quantizer further includes a second MOS transistor M2 in addition to the ULG 100 illustrated in FIG. 1. The input signal $V_{in}$ is simultaneously applied to a gate terminal $C_g$ of the SET and the output terminal $V_{out}$ through the second MOS transistor M2 in response to a control clock signal CLK.

FIG. 5 is a view illustrating a relationship between the input voltage $V_{in}$ of the quantizer illustrated in FIG. 4 and the current $I_d$ flowing to the SET. FIG. 6 is a view illustrating a relationship between the input voltage $V_{in}$ of the quantizer illustrated in FIG. 4 and the voltage level of the output node $V_{out}$.

Since FIG. 5 is the same as FIG. 2 described above, so that a description is omitted. Referring to FIG. 6, as the input voltage $V_{in}$ increases, the voltage level $V_{out}$ of the output node has a shape of stairs, so that the quantizer illustrated in FIG. 4 is a multi-valued quantizer representing a plurality of values instead of representing only two values including logic high and logic low values illustrated in FIG. 3.

The multi-valued quantizer may be implemented by using the second MOS transistor M2 and the control clock signal CLK illustrated in FIG. 4, and a voltage level represented as a stair and an adjacent stair representing a different voltage level can be distinguished by each period of the control clock signal CLK. The input voltage $V_{in}$ is transmitted to the output node $V_{out}$ in addition to the gate terminal $C_g$ of the SET through the second MOS transistor M2 by the control clock signal CLK. In this case, the voltage level $V_{out}$ of the output terminal of the quantizer responses on the basis of the received input voltage $V_{in}$. Therefore, since the voltage level $V_{out}$ of the output node is influenced by the input signal $V_{in}$ that is newly transmitted by a next control clock signal CLK, when the input voltage $V_{in}$ is received again by the control clock signal CLK, the voltage level $V_{out}$ of the output node is changed according to the received input voltage $V_{in}$. When the input voltage $V_{in}$ is continuously applied, correspondingly, a plurality of voltage levels $V_{out}$ of the output node can be obtained.

FIG. 7 is a view illustrating a multi-valued static random access memory (SRAM) using the quantizer illustrated in FIG. 4. Referring to FIG. 7, the multi-valued SRAM includes five MOS transistors M1 to M5 and an SET.

The third MOS transistor M3 has a terminal connected to a bit line BL and a gate connected to a word line WL. The second MOS transistor M2 has a terminal connected to a first voltage source terminal $V_{dd}$ and the other terminal and a gate connected to a charge storage node SN. The first MOS transistor M1 has a terminal connected to the charge storage node SN and a gate connected to a second voltage source terminal $V_{ss}$.

The SET has a terminal connected to the other terminal of the first MOS transistor M1, the other terminal connected to the second voltage source terminal $V_{ss}$, and a gate connected to the charge storage node SN. The fourth MOS transistor M4 has a terminal connected to the second voltage source terminal $V_{ss}$ and a gate connected to the charge storage node SN. The fifth MOS transistor M5 has a terminal connected to a source line SL, the other terminal connected to the other terminal of the fourth MOS transistor M4, and a gate connected to a sub word line SWL.

FIG. 8 is a waveform diagram of signals used to write (referred to as store) or read data to or from the multi-valued SRAM illustrated in FIG. 7. Referring to FIG. 8, in order to write data to the multi-valued SRAM, a voltage to be written to the multi-valued SRAM has to be precharged to the bit line BL. The voltage to be written is determined by the number of bits to be represented by the multi-valued SRAM, and when it is assumed that two bits are used, four different voltage levels can be obtained. Specifically, the two bits can represent '00', '01', '10', and '11'. Here, it is assumed that the voltage level corresponding to '00' is the smallest, and the voltage level corresponding to '11' is the largest.

When the word line WL is enabled in a logic high state after the voltage to be written is precharged to the bit line BL, the third MOS transistor M3 is turned on so as to enable the precharge voltage to be transmitted to the charge storage node SN. Since the transmitted voltage is applied to a gate, a constant current flows to the SET according to the transmitted voltage. Unless power supply is intentionally blocked, the constant current flows from the first voltage source terminal $V_{dd}$ through the second and first MOS transistors M2 and M1 and the SET to the second voltage source terminal $V_{ss}$, so that charges stored in the charge storage node SN are not vanished. Therefore, the SRAM illustrated in FIG. 7 does not need a refresh operation and can vary written voltage values, so that the SRAM is specifically the multi-valued SRAM.

In order to read data written to the multi-valued SRAM, the sub word line SWL is enabled, and the data written to the charge storage node SN of the multi-valued SRAM can be detected through the source line SL precharged at a predetermined voltage. Specifically, since the charge storage node SN is applied to the gate of the fourth MOS transistor M4, a current that can flow through the fourth MOS transistor M4 is determined by the charge storage node SN. In this case, a current flowing to the source line SL precharged at the predetermined voltage can also be changed by the charge storage node SN, so that the current is also detected to read the data value written to the multi-valued SRAM.

However, the conventional multi-valued SET SRAM continuously flows a current of about $I_d$ to the SET per cell in order to maintain the data, so that there is a problem in that a standby current is significantly increased as a density is increased.

In addition, in order to configure an array using the conventional multi-valued SET SRAM cells, two row lines WL and SWL and two column lines BL and SL are required per cell, so that there is a problem in that the entire area of the memory is increased.

DISCLOSURE OF INVENTION

Technical Problem

The present invention provides a multi-valued dynamic random access memory (DRAM) cell using a single electron transistor (SET) and a multi-valued DRAM cell array using the cell, capable of reducing a standby current for maintaining written data by refreshing a data value written the SET by a predetermined period, and storing information having two or more bits with a low power consumption.

The present invention also provides a multi-valued DRAM cell using the SET capable of individually applying refresh signals to a load current transistor for supplying a load current to the SET and a voltage control transistor for stably supplying a voltage low enough to satisfy a coulomb-blockade condition to a terminal of the SET so as to enable the two transistors to be individually turned on.

Technical Solution

According to an aspect of the present invention, there is provided a multi-valued dynamic random access memory (DRAM) cell using a single electron transistor (SET) including: a switching transistor to which a data value is transmitted through a bit line; a storage capacitor which is connected to a charge storage node to which charges are supplied when the switching transistor is turned on and stores a data value; a load current transistor having a terminal connected to the charge storage node and controlling current supply from a current source to the SET; a voltage control transistor having a terminal connected to the charge storage node so as to be connected to the load current transistor, and the other terminal connected to the SET so as to control a terminal voltage of the SET; the SET having a terminal connected to the voltage control transistor, the other terminal connected to a voltage source terminal, and a gate connected to the charge storage node; and a refresh signal unit which is connected to gates of the load current transistor and the voltage control transistor, is enabled by a predetermined period to turn on the transistors, and applies refresh signals for recharging the storage capacitor.

In the above aspect of the present invention, the refresh signal unit may be configured so that the first refresh signal SSG for turning on the load current transistor and the second refresh signal SSO for turning on the voltage current transistor are simultaneously enabled with values of equal to or more than a threshold voltage of the SET to simultaneously turn on the transistors.

In addition, the refresh signal unit may be configured so that the first refresh signal SSG for turning on the load current transistor and the second refresh signal SSO for turning on the voltage control transistor are independently enabled to individually turn on the transistors.

In addition, the refresh signal unit may be configured so that the voltage level applied by the first refresh signal SSG is equal to or larger than the sum of a threshold voltage of the load current transistor and a voltage written to the charge storage node and the voltage level applied by the second refresh signal SSO is similar to a threshold voltage of the voltage control transistor so as to apply different refresh signals to the transistors.

BRIEF DESCRIPTION OF THE DRAWINGS

FIG. 1 is a circuit diagram of a universal literal gate (ULG) using a single gate single electron transistor (SET) and a metal-oxide-semiconductor (MOS) transistor.

FIG. 2 is view illustrating a relationship between an input voltage $V_{in}$ of the ULG illustrated in FIG. 1 and a current $I_d$ flowing to the SET.

FIG. 3 is a view illustrating a relationship between the input voltage $V_{in}$ of the ULG illustrated in FIG. 1 and an output voltage $V_{out}$.

FIG. 4 is a circuit diagram of a quantizer using the ULG illustrated in FIG. 1.

FIG. 5 is a view illustrating a relationship between the input voltage $V_{in}$ of the quantizer illustrated in FIG. 4 and the current $I_d$ flowing to the SET.

FIG. 6 is a view illustrating a relationship between the input voltage $V_{in}$ of the quantizer illustrated in FIG. 4 and a voltage level of the output node $V_{out}$.

FIG. 7 is a view illustrating a multi-valued static random access memory (SRAM) using the quantizer illustrated in FIG. 4.

FIG. 8 is a waveform diagram of signals used to write or read data to or from the multi-valued SRAM illustrated in FIG. 7.

FIG. 9 is a circuit diagram of a multi-valued DRAM cell individually applied with first and second refresh signals according to the present invention.

FIG. 10 is a view illustrating a multi-valued DRAM cell array according to the present invention.

FIG. 11 is a view illustrating waveforms of signals when data is written to the multi-valued DRAM cell illustrated in FIG. 9.

FIG. 12 is a view illustrating waveforms of the signals when the multi-valued DRAM cell illustrated in FIG. 9 is in a standby state or in a refresh operation.

FIG. 13 is a view illustrating waveforms of the signals when data written to the multi-valued DRAM cell illustrated in FIG. 9 is read.

FIG. 14 is a waveform diagram of signals used to write or read data to or from the multi-valued DRAM cell according to the present invention.

FIG. 15 is a diagram for explaining a method of reading data written to the multi-valued DRAM cell according to the present invention.

FIG. 16 is a waveform diagram of signals used to read the data written to the multi-valued DRAM cell illustrated in FIG. 15.

BEST MODE FOR CARRYING OUT THE INVENTION

Hereinafter, exemplary embodiments of the present invention will be described in detail with reference to the attached drawings.

A dynamic random access memory (DRAM) cell using a single electron transistor (SET) illustrated in a circuit diagram of FIG. 9 includes switching transistors M1 and M2 to which a data value is transmitted through a bit line BL, a capacitor Cs where electric charges are stored, a SET, a load current transistor M4 for controlling current supply to the SET, a voltage control transistor M5 for controlling a terminal voltage of the SET, and a refresh signal unit SSG and SSO for turning on the load current transistor M4 and the voltage control transistor M5.

The switching transistors M1 and M2 include the first metal-oxide-semiconductor (MOS) transistor M1 and the second MOS transistor M2 for performing a switching operation of transmitting the data value that is transmitted through the bit line BL by an enable signal applied from column lines RWL and WWL to a charge storage node SN.

Here, the first MOS transistor M1 has a terminal connected to the bit line BL and a gate connected to the read word line RWL. In addition, the second MOS transistor M2 has a terminal connected to the other terminal of the first MOS transistor M1, the other terminal connected to the charge storage node SN, and a gate connected to the write word line WWL.

The storage capacitor Cs has a terminal connected to the charge storage node SN and the other terminal connected to a second voltage source terminal $V_{ss}$.

The SET has a terminal connected to a terminal of the voltage control transistor M5, the other terminal connected to the second voltage source terminal $V_{ss}$, and a gate connected to the charge storage node SN.

The fourth MOS transistor M4 that is the load current transistor has a terminal connected to the charge storage node SN, a gate applied with the first refresh signal SSG, and the other terminal connected to a current source (not shown) for supplying a predetermined current $I_o$.

The fifth MOS transistor M5 that is the voltage control transistor has a terminal connected to the charge storage node SN, a gate applied with the second refresh signal SSO, and the other terminal connected to the terminal of the SET.

The refresh signal unit includes the first refresh signal SSG applied to the fourth MOS transistor M4 and the second refresh signal SSO applied to the fifth MOS transistor M5. Here, the first and second refresh signals may be configured to be independently enabled and controlled so that voltage levels applied to the fourth and fifth MOS transistors M4 and M5 are different from each other.

Specifically, the voltage level of the second refresh signal SSO for turning on the fifth MOS transistor M5 during a refresh operation has a value equal to or larger than a threshold voltage of the fifth MOS transistor M5. In addition, a voltage stored (referred to as written) in the charge storage node SN has a voltage value $V_{SN}$ larger than 0 volt, so that the voltage level of the first refresh signal SSG for turning on the fourth MOS transistor M4 may be equal to or larger than a value of (Vth+$V_{SN}$) so as to satisfy a coulomb-blockade condition.

Therefore, when it is assumed that the threshold voltage of the fifth MOS transistor M5 and a threshold voltage of the fourth MOS transistor M4 are the same, and when the voltage level of the second refresh signal SSO has the same value as the threshold voltage, the fourth MOS transistor M4 is not turned on, so that the current $I_o$ of the current source for the refresh operation cannot be supplied to the charge storage node SN. Therefore, the first and second refresh signals SSG and SSO are separated and individually controlled so that the fourth and fifth MOS transistors M4 and M5 are applied with different voltage levels from each other.

In addition, even when the terminal of the fifth MOS transistor M5, that is, a drain voltage of the SET is not a very low voltage such as 10☐, the coulomb-blockade condition is satisfied and a coulomb-oscillation operation is performed, a voltage level of the gate of the fifth MOS transistor M5 is not limited, so that the gate terminals of the fourth and fifth MOS transistors M4 and M5 may be applied with the same refresh signal. Furthermore, the gate terminals of the fourth and fifth MOS transistors M4 and M5 may be configured to be simultaneously applied with a single refresh signal. In other words, the refresh signal unit may be configured so that the first and second refresh signals SSG and SSO are applied through a common node connected to the gates of the fourth and fifth MOS transistors M4 and M5 so as to simultaneously turn on the two transistors M4 and M5.

In addition, according to the embodiment, a read current transistor M3 for flowing a current proportionate to a voltage stored in the charge storage node SN may further be included to read data.

Here, the third MOS transistor M3, that is, the read current transistor has a terminal connected to a common terminal between the first and second MOS transistors M1 and M2, the other terminal connected to a read switch M6 applied with a read auxiliary signal SCEN, and a gate connected to the charge storage node SN.

The read switch may be implemented as a MOS transistor M6 having a terminal connected to the other terminal of the third MOS transistor M3, the other terminal connected to a ground GND or the second voltage source terminal $V_{ss}$, and a gate applied with the read auxiliary signal SCEN. The read auxiliary signal SCEN is enabled only when data stored in a multi-valued dynamic random access memory (DRAM) cell is to be read.

Here, when the other terminal (a source node according to the embodiment) of the third MOS transistor M3 is not directly connected to the ground but connected to the MOS transistor M6 implemented as the read switch, the read auxiliary signal SCEN is turned off to be set to 0 volt when the data is written so that the level of the charge storage node SN is not influenced, and the read auxiliary signal SCEN is enabled when the data is to be read so that the other terminal (the source node according to the embodiment) of the third MOS transistor M3 is set to be a ground level and a current flows from a precharge circuit connected to the bit line BL through the bit line BL to the first and third MOS transistors M1 and M3. In addition, the other terminal of the third MOS transistor M3, that is, a SC node is commonly connected in a column unit to be used, and this reduces an occupied area.

As described above, when the data is read since the current corresponding to the SC node voltage that is stored flows to the bit line BL, charges are not shared with the bit line in the data reading operation unlike in a conventional DRAM, but the third MOS transistor that is the read current transistor is used to read the data.

In a multi-valued DRAM cell array using the SET illustrated in FIG. 10 according to the present invention, a plurality of the multi-valued DRAM cells illustrated in FIG. 9 are two-dimensionally arrayed. In addition, a plurality of bit lines BL0 to BL3, a plurality of read word lines RWL0 to RWL3, a plurality of write word lines WWL0 to WWL3, a plurality of first refresh lines SSG0 to SSG3, a plurality of second refresh lines SSO0 to SSO3, and a read auxiliary block 1010 are included.

Each of the multi-valued DRAM cells is connected to a corresponding bit line, a read word line, a write word line, a first refresh line, and a second refresh line. In addition, the other terminal of the third MOS transistor M3 is connected to the read auxiliary block 1010, and the read auxiliary block 1010 operates in response to the read auxiliary signal SCEN.

In a plurality of the two-dimensionally arrayed multi-valued DRAM cells, the other terminals of the third MOS transistors M3 included in the multi-valued DRAM cells arrayed at each of vertical or horizontal lines form a common line to be connected to the read auxiliary block 1010.

The read auxiliary block 1010 has a terminal connected to the second voltage source terminal $V_{ss}$ and the other terminal including a plurality of MOS transistors M6 to M9 connected to the common line. Gates of a plurality of the MOS transistors are commonly applied with the read auxiliary signal SCEN.

In FIG. 10, the first and second refresh signals SSG and SSO are parallel with the two word lines WWL and RWL, however, in some cases, the first and second refresh signals SSG and SSO may be parallel with the bit line BL.

Now, operations of writing data to the multi-valued DRAM cell using the SET, operations of the multi-valued DRAM cell using the SET in a standby state and in a refresh mode, and operations of reading the data written to the multi-valued DRAM cell using the SET are described.

FIG. 11 is a view illustrating waveforms of signals when data is written to the multi-valued DRAM cell using the SET. Referring to FIG. 11, in order to write the data to the multi-valued DRAM cell using the SET, a voltage to be written has to be precharged to the bit line BL. For the convenience of description, the MOS transistors illustrated in FIG. 9 are assumed to have an N-type. The voltage applied to the bit line BL is transmitted to the charge storage node SN through the first and second MOS transistor M1 and M2 that are turned on, by the enabled write word line WWL and the read word line RWL.

In order to operate the multi-valued DRAM cell according to the voltage precharged to the bit line BL and transmitted to the charge storage node SN, the fourth and fifth MOS transistors M4 and M5 have to be simultaneously turned on. For this, the second refresh signal SSO for turning on the fifth MOS transistor M5 has to have a level of the threshold voltage $V_{th}$ of the fifth MOS transistor M5, and the first refresh signal SSG for turning on the fourth MOS transistor M4 has to have a level equal to or larger than (Vth for M4+$V_{SN}$), that is, the sum of the threshold voltage of the fourth MOS transistor M4 and the voltage value $V_{SN}$ stored in the charge storage node SN. Correspondingly, the voltage level applied by the second refresh signal SSO may be configured to have the voltage level equal to or larger than the threshold voltage $V_{thn}$ of the SET, and the voltage level applied by the first refresh signal SSG may be configured to have a value of a third voltage source terminal $V_{cc}$.

Specifically, since the voltage $V_{SN}$ stored in the charge storage node SN connected between the source terminal of the fourth MOS transistor M4 and the drain terminal of the fifth MOS transistor M5 is equal to or larger than 0 volt, in order to turn on the fourth MOS transistor M4, the first refresh signal SSG having the voltage level equal to or larger than the threshold voltage $V_{th}$ of the fourth MOS transistor M4 and the voltage $V_{SN}$ stored in the charge storage node has to be applied. Correspondingly, after the fifth MOS transistor M5 is turned on, the coulomb-blockade condition is maintained, and a load current $I_o$ is supplied to the charge storage node SN to perform a refresh operation.

In addition, even when the drain voltage of the SET is not a very low voltage such as 10□, the coulomb-blockade condition is satisfied and the coulomb-oscillation operation is performed, the first and second refresh signals are connected to the gates of the fourth and fifth MOS transistors through the common node, so that the first and second refresh signals have to have the voltage level equal to or larger than the threshold voltage $V_{thn}$ to simultaneously turn on the two MOS transistors M4 and M5.

Here, although not shown in the figure, the read auxiliary signal SCEN has the voltage level of the ground voltage GND or the second voltage source terminal $V_{ss}$ to turn off the sixth MOS transistor M6 so that the common terminal SC between the third and sixth MOS transistors M3 and M6 have to be in a floating state. By the aforementioned signals, the current of $I_o$ Ampere flows to the SET.

FIG. 12 is a view illustrating waveforms of the signals when the multi-valued DRAM cell illustrated in FIG. 9 is in a standby state or in a refresh operation. Referring to FIG. 12, the waveforms of the signals have to satisfy conditions of the center section of three sections divided by two dotted lines when the multi-valued DRAM cell operates in the refresh mode and satisfy conditions of remaining two sections in the standby state.

In the standby state, the write word line WWL, the read word line RWL, the first refresh signal SSG, the second refresh signal SSO, and the read auxiliary signal SCEN are disabled. Therefore, the write word line WWL, the read word line RWL, the refresh signals SSG and SSO, and the read auxiliary signal SCEN have the voltage level of the ground voltage GND or the second voltage source terminal $V_{ss}$. The common terminal SC between the third and sixth MOS transistors M3 and M6 has to be in a floating state. Since the two MOS transistors M4 and M5 are turned off by the disabled first and second refresh signals SSG and SSO, a current i(SET) flowing to the SET is 0 Ampere. In this case, charges stored in the terminal of the storage capacitor Cs, that is, the charge storage node SN leak through various paths. Therefore, the refresh operation has to be performed within a predetermined time.

In the refresh operation, similar to the aforementioned standby state, the voltage levels of the read word line RWL and the write word line WWL are set to turn off the first and second MOS transistors M1 and M2. However, the first and second refresh signals SSG and SSO have the voltage levels to turn on the fourth and fifth MOS transistors M4 and M5, respectively, as illustrated in FIG. 12. Here, the current $I_o$ Ampere corresponding to the data value stored in advance flows to the SET, so that the multi-valued DRAM cell is refreshed. In addition, periods and widths of the first and second refresh signals SSG and SSO may be changed according to the storage capacitor Cs.

FIG. 13 is a view illustrating waveforms of the signals when data written to the multi-valued DRAM cell illustrated in FIG. 9 is read. Referring to FIG. 13, in order to read the data written to the multi-valued DRAM cell, the read word line RWL and the read auxiliary signal SCEN are enabled to turn on the first and sixth MOS transistors M1 and M6, respectively.

Since the second MOS transistor M2 is turned off by the write word line WWL having the voltage level of the ground voltage GND, a current flowing to the third MOS transistor M3 is determined according to the voltage level of the charge storage node SN. Although not shown in the figure, in order to read the data stored in the multi-valued DRAM cell illustrated in FIG. 9, a predetermined comparison voltage is precharged to the bit line BL. Therefore, by detecting a difference between the voltage level of the charge storage node SN and the voltage precharged to the bit line BL, the voltage level of the charge storage node SN can be perceived. A method of detecting the voltage level of the charge storage node SN will be described later.

FIG. 14 is a waveform diagram of signals used to write or read data to or from the multi-valued DRAM cell according to the present invention. Referring to FIG. 14, in order to write data to the multi-valued DRAM cell, in a state where the write word line WWL and the read word line RWL are enabled, a predetermined voltage has to be applied to the bit line BL. Here, the predetermined voltage is different according to the number of bits to be written to the multi-valued DRAM cell. When data having two bits is to be written to the multi-valued DRAM cell, four voltages are written, and when data having three bits is to be written, eight voltages are written.

Hereinafter, a case where the data having two bits is to be written is exemplified. Referring to FIG. 14, the data implemented as two bits includes '00', '01', '10' and '11', and it is assumed that a voltage corresponding to '00' is smallest and a voltage corresponding to '11' is largest.

In a section between t1 and t2, the write word line WWL and the read word line RWL are enabled. In this section, a data voltage to be written to the multi-valued DRAM cell is precharged to the bit line BL. The data voltage is transmitted to the charge storage node SN to be written. Specifically, when a voltage corresponding to a logic value is applied to the bit line to write data, a corresponding voltage is stored to the charge storage node SN through the first and second MOS transistors M1 and M2 that are switching transistors. Here, since the third transistor is in the OFF state, there is no current flowing through the third transistor, so that additional power consumption is not needed and a voltage loss of the charge storage node SN does not occur. As described above, when storing the voltage in the charge storage node SN is completed, at the t2 timing, the write word line WWL is turned off, and at the t3 timing, the bit line BL is precharged to the ground, thereby completing the data write operation.

Thereafter, in order to read the stored data voltage, in a state where the write word line WWL is maintained as the ground, the read word line RWL and the read auxiliary signal SCEN are turned on. Consequently, the current flows from the precharge transistor connected to the bit line BL through a Y decoder and the bit line BL to the third transistor.

FIG. 15 is a diagram for explaining a method of reading data written to the multi-valued DRAM cell according to the present invention. Referring to FIG. 15, when an Y decoding signal YA is enabled in order to read the data written to the multi-valued DRAM cell, a main current $I_{main}$ flows from the precharge transistor P0 through the bit line BL and the first, third, sixth MOS transistors M1, M3, and M6 of the multi-valued DRAM cell to the second voltage source terminal $V_{ss}$. The voltage level of the charge storage node SN applied to the gate of the third MOS transistor M3 determines the main current $I_{main}$.

In order to detect the main current $I_{main}$ flowing through the multi-valued DRAM cell (referred to as main cell), a reference cell which has the same structure as the multi-valued DRAM cell (main cell) and stores a reference voltage $V_{ref}$ is used. When a reference Y decoding signal RYA is enabled while the Y decoding signal YA is enabled, the reference current $I_{ref}$ flows from the precharge transistor P3 of the ref reference cell through a reference bit line RBL and first, third, sixth MOS transistors RM1, RM3, and RM6 of the reference cell to the second voltage source terminal $V_{ss}$.

Thereafter, a gate voltage $V_m$ of the precharge transistor P0 for generating the main current $I_{main}$ is buffered to generate a main voltage $V_{main}$, and a gate voltage $V_R$ of a reference voltage transistor P3 for generating a reference current $I_{ref}$ is buffered to generate the reference voltage $V_{ref}$. Since two transistors P0 and P1 have a current mirror relationship, if gate widths and gate lengths of the two MOS transistors P0 and P1 have the same values, currents flowing through the two MOS transistors P0 and P1 are the same, and therefore the two voltages $V_m$ and $V_{main}$ have the same voltage level.

In addition, since two MOS transistors P2 and P3 have the current mirror relationship, by the same reason, the two voltages $V_R$ and $V_{ref}$ have the same voltage level. A sense amplifier S/A receives the main voltage $V_{main}$ and the reference voltage $V_{ref}$ to compare magnitudes of the main voltage $V_{main}$ and the reference voltage $V_{ref}$. By using an output signal $V_{out}$ of the sense amplifier S/A, the data written to the multi-valued DRAM cell (main cell) can be detected.

According to a result of the detecting, when the voltage level of the main voltage $V_{main}$ is higher than that of the reference voltage $V_{ref}$, the voltage level of the reference voltage $V_{ref}$ is increased by a degree, and the comparison is performed again. This operation is repeatedly performed until the main voltage $V_{main}$ is equal to or smaller than the reference voltage $V_{ref}$ to detect digital data that the main voltage $V_{main}$ means. In order to change the voltage level of the reference voltage $V_{ref}$, voltage to be changed is stored in the reference cell illustrated in FIG. 15.

FIG. 16 is a waveform diagram of signals used to read the data written to the multi-valued DRAM cell illustrated in FIG. 15. Referring to FIG. 16, when the data written to the multi-valued DRAM cell is read, a relationship between the gate voltage $V_m$ of the precharge transistor P0 and the gate voltage $V_R$ of the precharge transistor P3 of the reference cell may be represented as Math FIG. 1. For the convenience of description, it is assumed that binary data is written to the multi-valued DRAM cell.

MathFigure 1

$$V_{m'1'} < V_R < V_{m'0'}$$

Here, $V_{m'1'}$ denotes the gate voltage $V_m$ of the precharge transistor P0 when a logic value of '1' is written to the multi-valued DRAM cell, and $V_{m'0'}$ denotes the gate voltage when a logic value of '0' is written. Therefore, the voltage level of the main voltage $V_{main}$ and the voltage level of the reference voltage $V_{ref}$ may be represented as Math FIG. 2.

MathFigure 2

$$V_{main'1'} < V_{ref} < V_{main'0'}$$

Here, $V_{main'1'}$ denotes a voltage $V_{main}$ input to the sense amplifier when the logic value of '1' is written to the multi-valued DRAM cell, and $V_{main'0'}$ denotes a voltage when the logic value of '0' is written.

When it is assumed that a storage voltage corresponding to the logic '0' is referred to as a voltage $V_{SN'0'}$ and a storage voltage corresponding to the logic '1' is referred to as a voltage $V_{SN'1'}$, a relationship between the voltage $V_{RSN}$ at the charge storage node RSN of the reference cell and the voltage $V_{SN}$ of the charge storage node SN of the multi-valued DRAM cell (main cell) may be represented as Math FIG. 3.

MathFigure 3

$$V_{SN'0'} < V_{RSN} < V_{SN'1'}$$

The main current $I_{main}$ and the reference current $I_{ref}$ are determined by the voltage level of the charge storage node SN of the multi-valued DRAM cell and the voltage level of the charge storage node RSN of the reference cell, respectively, and may be represented as Math FIG. 4.

MathFigure 4

$$I_{main'0'} < I_{ref} < I_{main'1'}$$

Here, a result of comparing the main voltage $V_{main}$ with the reference voltage $V_{ref}$ may be determined by the comparison signal $V_{out}$ output from the sense amplifier.

As described above, when data is to be written to the multi-valued DRAM cell using the SET according to the present invention, the write word line WWL and the read word line RWL are simultaneously enabled to write a voltage level corresponding to multi-valued data to the charge storage node SN.

Here, voltages for turning on the fourth and fifth MOS transistors M4 and M5 are applied to the gates of the fourth and fifth MOS transistors M4 and M5 for controlling the current flowing to the SET. For example, when the voltage level of the second refresh signal SSO is $(V_{thn}+10)\square$, the voltage value of the common node between the fifth MOS transistor M5 and the SET is $10\square$, so that coulomb-blockade is possible.

While the written data is maintained (referred to as standby), the voltages of the first and second refresh signals SSG and SSO are set to 0V so that a current does not flow to the SET. Accordingly, in the standby mode, power consumption of the multi-valued DRAM cell can be minimized.

During a data refresh section, the first and second refresh signals SSG and SSO having magnitudes to turn on the fourth and fifth MOS transistors M4 and M5 are applied to the gates of the fourth and fifth MOS transistors M4 and M5 to enable the current flowing from the SET to re-charge the storage capacitor Cs. Here, the write word line WWL and the read word line RWL are applied with 0V to turn off the first and second MOS transistors M1 and M2. When refreshing the charge storage node SN is completed, the fourth and fifth MOS transistors M4 and M5 are turned off to prevent the current from flowing to the SET.

In addition, when the data written to the multi-valued DRAM cell is read, the first and third MOS transistors M1 and M3 are turned on. Here, when the precharge transistor P0 is connected to the bit line BL so that a current flows thereto, the current flowing through the bit line BL is changed according to the voltage of the charge storage node SN applied to the gate of the third MOS transistor M3. By using the changed current, detecting the data written to the multi-valued DRAM cell is possible.

A conventional DRAM uses a method of detecting charges by sharing charges stored in the storage capacitor Cs with a bit line capacitor. In this method, after reading the written data, the shared charges have to be restored. However, in the method according to the present invention, sharing the written data, that is, sharing charges is not performed when the written data is read, so that the charges does not need to be restored. Therefore, after reading the data, an additional charge restoring cycle is not needed, so that it is simple, and power consumption is relatively reduced.

The fourth and fifth MOS transistors M4 and M5 serve as switches for flowing or blocking the current to the SET and have functions of enabling the common node between the SET and the fifth MOS transistor M5 to have a voltage low enough to maintain the coulomb-blockade condition.

As described above, according to the present invention, in order to write a plurality of different voltage levels corresponding to a plurality of pieces of digital data, a single storage capacitor Cs is used. In addition, in order to maintain the written data, the fourth and fifth MOS transistors are turned on and off by a predetermined period instead of continuously flowing the current to the SET. Here, the first and second refresh signals SSG and SSO having proper values to turn on both the fourth and fifth MOS transistors M4 and M5 and maintain the stable coulomb-blockade condition are applied to the gates of the fourth and fifth MOS transistors M4 and M5.

In general, since charges stored in a capacitor can be maintained for several msec or tens of msec, the refresh operation is performed by periods of several msec or tens of msec. When it is assumed that the current consumed to refresh data by the SET in a unit cell is $100\square$, in a semiconductor device having a 256M cell array, a standby current is about $30\square$, and the standby current is relatively higher than a standby current of a conventional DRAM having a value of about $1\square$.

However, in the DRAM cell having the structure according to the present invention, when it is assumed that the refresh period is about 1 msec, and a time to perform the refresh operation is about 100 ns, an average standby current is less than several $\square$ as represented by Math FIG. 5.

MathFigure 5

$$\frac{100 \text{ pA} \times 256 \text{ M cell} \times 100 \text{ ns}}{1 \text{ m sec}} = 3 \text{ } \mu\text{A}$$

A conventional static random access memory (SRAM) has a larger area occupied in a layout as compared with a DRAM and smaller power consumption. However, the DRAM cell using the SET according to the present invention can reduce the power consumption $10^5$ times as compared with a SRAM using a SET.

While the present invention has been particularly shown and described with reference to exemplary embodiments thereof, it will be understood by those skilled in the art that various changes in form and details may be made therein without departing from the spirit and scope of the present invention as defined by the appended claims.

INDUSTRIAL APPLICABILITY

The standby current for maintaining the written data is reduced by performing the refresh operation on the data value written to the SET by a predetermined period, so that the power consumption can be significantly reduced.

In addition, the refresh signal includes the first and second refresh signals for turning on the load current transistor for controlling current supply to the SET and the voltage control transistor for controlling a terminal voltage of the SET, respectively, and the first and second refresh signals are applied with different values. Therefore, the load current transistor and the voltage current transistor are stably turned on to significantly reduce the standby current and satisfy the coulomb-blockade condition.

The invention claimed is:

1. A multi-valued DRAM (dynamic random access memory) cell using a SET (single electron transistor) comprising:
a switching transistor to which a data value is transmitted through a bit line BL;
a storage capacitor which is connected to a charge storage node to which charges are supplied when the switching transistor is turned on and stores a data value;
a load current transistor having a terminal connected to the charge storage node and controlling current supply from a current source to the SET;
a voltage control transistor having a terminal connected to the charge storage node so as to be connected to the load current transistor, and the other terminal connected to the SET so as to control a terminal voltage of the SET;
the SET having a terminal connected to the voltage control transistor, the other terminal connected to a voltage source terminal, and a gate connected to the charge storage node; and
a refresh signal unit which i) is connected to gates of the load current transistor and the voltage control transistor, ii) is enabled by a predetermined period to turn on the transistors, and iii) applies refresh signals for re-charging the storage capacitor.

2. The multi-valued DRAM cell of claim 1, wherein the switching transistor comprises a first MOS (metal-oxide-semiconductor) transistor M1 having a terminal connected to the bit line BL and a gate connected to a read word line RWL and a second MOS transistor M2 having a terminal connected to the other terminal of the first MOS transistor M1, the other terminal connected to the charge storage node SN, and a gate connected to a write word line WWL,
wherein the load current transistor comprises a fourth MOS transistor M4 having a terminal connected to the charge storage node SN and a gate applied with a first refresh signal SSG,
wherein the voltage control transistor comprises a fifth MOS transistor M5 having a terminal connected to the charge storage node SN and a gate applied with a second refresh signal SSO, and
wherein the multi-valued DRAM cell further comprises a read current transistor composed of a third MOS transistor M3 which is connected to a common terminal between the first and second MOS transistors M1 and M2 and has a gate connected to the charge storage node SN.

3. The multi-valued DRAM cell of claim 2, wherein the refresh signal unit is connected through a common node to enable the first refresh signal SSG for turning on the load current transistor and the second refresh signal SSO for turning on the voltage control transistor to be simultaneously turned on.

4. The multi-valued DRAM cell of claim 2, wherein the refresh signal unit is connected to the gates of the load current transistor and the voltage control transistor through different nodes so that the first refresh signal SSG for turning on the load current transistor and the second refresh signal SSO for turning on the voltage control transistor are independently enabled to individually turn on the transistors.

5. The multi-valued DRAM cell of claim 4, wherein a voltage level applied to the gate of the load current transistor by the first refresh signal SSG and a voltage level applied to the gate of the voltage control transistor by the second refresh signal SSO have different values from each other.

6. The multi-valued DRAM cell of claim 4, wherein the voltage level applied by the first refresh signal SSG is equal to or larger than the sum of a threshold voltage of the load current transistor and a voltage written to the charge storage node, and wherein the voltage level applied by the second refresh signal SSO is similar to a threshold voltage of the voltage control transistor.

7. The multi-valued DRAM cell of claim 2, wherein the other terminal of the fourth MOS transistor M4 is connected to a current source $I_o$.

8. The multi-valued DRAM cell of claim 2, wherein the other terminal of the third MOS transistor M3 further comprises a switch for performing a switching operation to a ground voltage or a second voltage source terminal $V_{ss}$.

9. The multi-valued DRAM cell of claim 8, wherein the switch is a sixth MOS transistor having a terminal connected to the other terminal of the third MOS transistor M3, the other terminal connected to the ground voltage or the second voltage source terminal $V_{ss}$, and a gate applied with a read auxiliary signal SCEN.

10. The multi-valued DRAM cell of claim 9, wherein the read auxiliary signal SCEN is enabled only when data written to the multi-valued DRAM cell is read.

11. The multi-valued DRAM cell of claim 2, wherein the bit line BL is connected to a voltage source for outputting two or more different voltage levels.

12. The multi-valued DRAM cell of claim 2, wherein periods of the first refresh signal SSG for opening and closing the fourth MOS transistor M4 and the second refresh signal SSO for opening and closing the fifth MOS transistor M5 are determined by a time to discharge the storage capacitor.

13. A multi-valued DRAM cell array using a SET, comprising a plurality of multi-valued DRAM cells of claim 2 that are two-dimensionally arrayed, a plurality of bit lines BL0 to BL3, a plurality of read word lines RWL0 to RWL3, a plurality of write word lines WWL0 to WWL3, a plurality of refresh lines SSG0 to SSG3 and SSO0 to SS03, and a read auxiliary block,
wherein each of the multi-valued DRAM cells is connected to a corresponding bit line, a corresponding read word line, a corresponding write word line, and a corresponding refresh line, and the other terminal of the third MOS transistor M3 is connected to the read auxiliary block, and
wherein the read auxiliary block operates in response to a read auxiliary signal SCEN.

14. The multi-valued DRAM cell array of claim 13, wherein the other terminals of the third MOS transistors M3 included in the multi-valued DRAM cells arrayed at each of vertical or horizontal lines form a common line to be connected to the read auxiliary block.

15. The multi-valued DRAM cell array of claim 14, wherein the read auxiliary block has a terminal connected to a second voltage source terminal $V_{ss}$, the other terminal having a plurality of MOS transistors connected to the common line, and wherein gates of a plurality of the MOS transistors are commonly applied with the read auxiliary signal SCEN.

16. The multi-valued DRAM cell array of claim 15, wherein the read auxiliary signal SCEN is enabled only when data written to the multi-valued DRAM cell array is read.

17. The multi-valued DRAM cell array of claim 13, further comprising:
a multi-valued DRAM reference cell having the same structure as the multi-valued DRAM cell; and
a sense amplifier, wherein the sense amplifier compares a current flowing through the bit line BL connected to the multi-valued DRAM cell with a current flowing through a reference bit line RBL connected to the multi-valued DRAM reference cell.

18. The multi-valued DRAM cell array of claim 17, wherein the multi-valued DRAM reference cell writes the same voltage value as one of a plurality of different voltage values written to the multi-valued DRAM cell.

* * * * *